US010910386B2

(12) United States Patent
Hsu et al.

(10) Patent No.: US 10,910,386 B2
(45) Date of Patent: Feb. 2, 2021

(54) SEMICONDUCTOR DEVICE AND METHOD FOR FABRICATING THE SAME

(71) Applicants: UNITED MICROELECTRONICS CORP., Hsin-Chu (TW); Fujian Jinhua Integrated Circuit Co., Ltd., Quanzhou (CN)

(72) Inventors: Wei-Lun Hsu, Taichung (TW); Hung-Lin Shih, Hsinchu (TW); Che-Hung Huang, Hsinchu (TW); Ping-Cheng Hsu, Taipei (TW); Hsu-Yang Wang, Tainan (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 15/943,721

(22) Filed: Apr. 3, 2018

(65) Prior Publication Data
US 2019/0279989 A1    Sep. 12, 2019

(30) Foreign Application Priority Data

Mar. 8, 2018  (CN) .......................... 2018 1 0189345

(51) Int. Cl.
| H01L 27/10 | (2006.01) |
| H01L 27/108 | (2006.01) |
| H01L 21/768 | (2006.01) |
| H01L 21/762 | (2006.01) |
| H01L 21/8234 | (2006.01) |
| H01L 21/8238 | (2006.01) |

(52) U.S. Cl.
CPC .. *H01L 27/10888* (2013.01); *H01L 21/76224* (2013.01); *H01L 21/76877* (2013.01); *H01L 27/10876* (2013.01); *H01L 21/823481* (2013.01); *H01L 21/823878* (2013.01); *H01L 27/10885* (2013.01)

(58) Field of Classification Search
CPC ..... H01L 21/823481; H01L 21/823878; H01L 27/10885; H01L 27/10888
See application file for complete search history.

(56) References Cited

U.S. PATENT DOCUMENTS

| 6,127,228 A | * | 10/2000 | Lee ................... H01L 21/76897 257/E21.507 |
| 6,153,471 A | * | 11/2000 | Lee ....................... H01L 27/115 257/E21.682 |
| 6,303,424 B1 | * | 10/2001 | Lee ................... H01L 27/10885 257/E21.648 |
| 6,455,886 B1 | * | 9/2002 | Mandelman ...... H01L 27/10823 257/301 |

(Continued)

FOREIGN PATENT DOCUMENTS

CN    108269805 A    7/2018

*Primary Examiner* — Nicholas J Tobergte
(74) *Attorney, Agent, or Firm* — Winston Hsu

(57) ABSTRACT

According to an embodiment of the present invention, a method for fabricating semiconductor device includes the steps of: forming a semiconductor layer on a substrate; removing part of the semiconductor layer and part of the substrate to form a trench; forming a liner in the trench; removing part of the liner to form a spacer adjacent to two sides of the trench; and forming a bit line structure in the trench.

11 Claims, 4 Drawing Sheets

(56) References Cited

U.S. PATENT DOCUMENTS

| | | | |
|---|---|---|---|
| 6,734,482 B1 * | 5/2004 | Tran | H01L 27/10814 |
| | | | 257/296 |
| 7,381,612 B2 * | 6/2008 | Suh | H01L 21/26513 |
| | | | 438/238 |
| 8,048,737 B2 * | 11/2011 | Kim | H01L 27/10891 |
| | | | 438/253 |
| 8,105,902 B2 * | 1/2012 | Shin | H01L 27/10876 |
| | | | 257/E29.262 |
| 8,344,517 B2 * | 1/2013 | Kim | H01L 21/7682 |
| | | | 257/774 |
| 8,969,936 B2 | 3/2015 | Lee et al. | |
| 9,082,755 B2 * | 7/2015 | Kim | H01L 27/10888 |
| 9,153,654 B2 * | 10/2015 | Lee | H01L 27/10888 |
| 9,230,853 B2 | 1/2016 | Yu et al. | |
| 2012/0126426 A1 | 5/2012 | Shin | |
| 2012/0153456 A1 * | 6/2012 | Kim | H01L 21/76897 |
| | | | 257/734 |
| 2013/0049085 A1 * | 2/2013 | Lin | H01L 27/10814 |
| | | | 257/296 |
| 2015/0171163 A1 | 6/2015 | Lee | |
| 2016/0148937 A1 * | 5/2016 | Park | H01L 27/10885 |
| | | | 257/296 |
| 2018/0175040 A1 * | 6/2018 | Kim | H01L 27/10814 |
| 2018/0190656 A1 * | 7/2018 | Ho | H01L 27/1085 |
| 2018/0308849 A1 * | 10/2018 | Kim | H01L 27/10888 |
| 2019/0088659 A1 * | 3/2019 | Lee | H01L 27/10855 |

* cited by examiner

US 10,910,386 B2

1

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly to a method for fabricating bit line of a dynamic random access memory (DRAM) device.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. Nevertheless, current DRAM units with buried gate structures still pose numerous problems due to limited fabrication capability. Hence, how to effectively improve the performance and reliability of current DRAM device has become an important task in this field.

SUMMARY OF THE INVENTION

According to an embodiment of the present invention, a method for fabricating semiconductor device includes the steps of: forming a semiconductor layer on a substrate; removing part of the semiconductor layer and part of the substrate to forma trench; forming a liner in the trench; removing part of the liner to form a spacer adjacent to two sides of the trench; and forming a bit line structure in the trench.

According to another aspect of the present invention, a semiconductor device includes: a bit line structure on a substrate and a spacer around the bit line structure, in which a top surface of the spacer is even with or lower than a top surface of the substrate.

Preferably, the semiconductor device further includes a shallow trench isolation (STI) in the substrate, the spacer is surrounded by the STI, and a top surface of the spacer is even with or lower than a top surface of the STI. The bit line structure preferably includes a conductive layer in the substrate, a metal layer on the conductive layer, and a mask layer on the metal layer, in which a bottom surface of the conductive layer is lower than a top surface of the substrate, and the spacer is between the conductive layer and the STI.

These and other objectives of the present invention will no doubt become obvious to those of ordinary skill in the art after reading the following detailed description of the preferred embodiment that is illustrated in the various figures and drawings.

2

Figure 1:
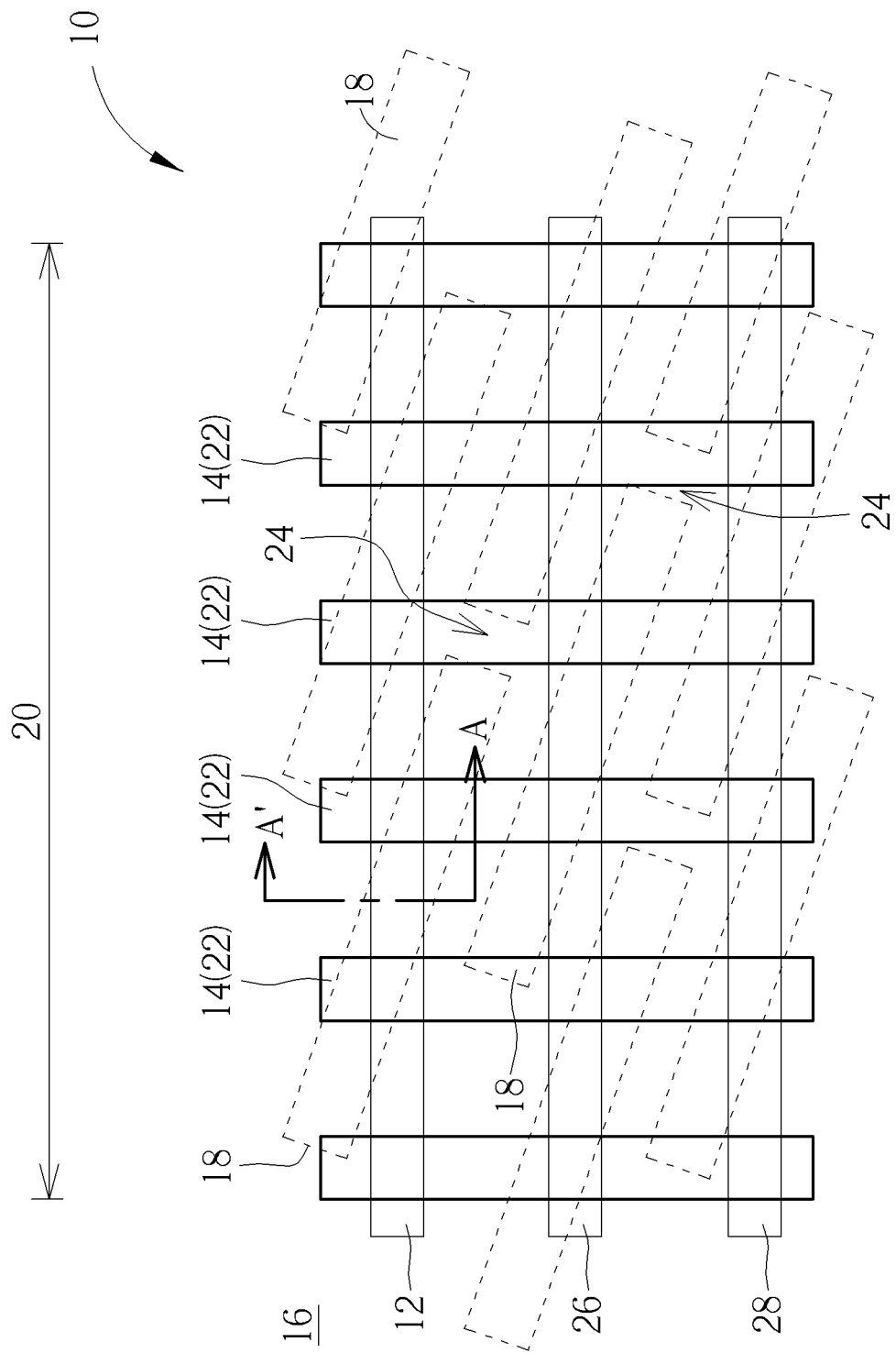
FIG. 1 illustrates a top view of a DRAM device according to an embodiment of the present invention.

FIGS. 2-6 are cross-sectional views illustrating steps for fabricating a bit line structure of the DRAM device of FIG. 1 along the sectional line AA'.

DETAILED DESCRIPTION

Referring to FIGS. 1-6, FIGS. 1-6 illustrate a method for fabricating a DRAM device according to an embodiment of the present invention, in which FIG. 1 illustrates a top-view diagram of a DRAM device and FIGS. 2-6 illustrate cross-sectional views of a method for fabricating a bit line of the DRAM device along the sectional line AA' of FIG. 1. Preferably, the present embodiment pertains to fabricate a memory device, and more particularly a DRAM device 10, in which the DRAM device 10 includes at least a transistor device (not shown) and at least a capacitor structure (not shown) that will be serving as a smallest constituent unit within the DRAM array and also used to receive electrical signals from bit lines 12, 26, 28 and word lines 14.

As shown in FIG. 1, the DRAM device 10 includes a substrate 16 such as a semiconductor substrate or wafer made of silicon, a shallow trench isolation (STI) 24 formed in the substrate 16, and a plurality of active areas (AA) 18 defined on the substrate 16. A memory region 20 and a periphery region (not shown) are also defined on the substrate 16, in which multiple word lines 14 and multiple bit lines 12, 26, 28 are preferably formed on the memory region 20 while other active devices (not shown) could be formed on the periphery region. For simplicity purpose, only devices or elements on the memory region 20 are shown in FIG. 1 while elements on the periphery region are omitted.

In this embodiment, the active regions 18 are disposed parallel to each other and extending along a first direction, the word lines 14 or multiple gates 22 are disposed within the substrate 16 and passing through the active regions 18 and STI 24. Preferably, the gates 22 are disposed extending along a second direction such as Y-direction, in which the second direction crosses the first direction at an angle less than 90 degrees.

The bit lines 12, 26, 28 on the other hand are disposed on the substrate 16 parallel to each other and extending along a third direction such as X-direction while crossing the active regions 18 and STI 24, in which the third direction is different from the first direction and orthogonal to the second direction. In other words, the first direction, second direction, and third direction are all different from each other while the first direction is not orthogonal to both the second direction and the third direction. Preferably, contact plugs such as bit line contacts (BLC) (not shown) are formed in the active regions 18 adjacent to two sides of the word lines 14 to electrically connect to source/drain region (not shown) of each transistor element and storage node contacts (not shown) are formed to electrically connect to a capacitor.

Figure 2:
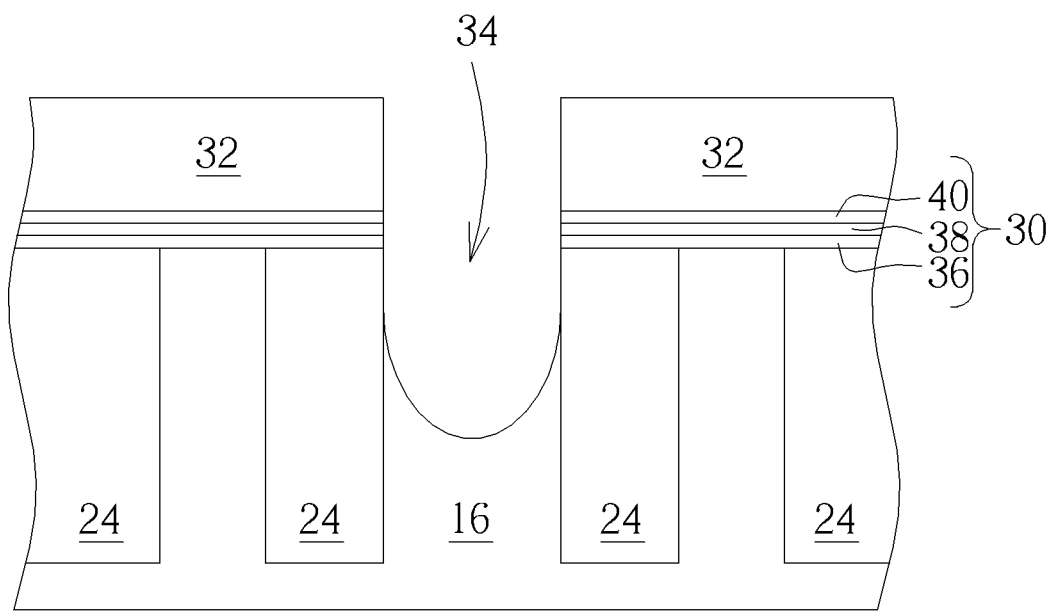

The fabrication process conducted after the formation of word lines 14 (or also referred to as buried word lines) and STI 24 is explained below. First as shown in FIG. 2, a STI 24 is formed in the substrate 16 to define the active regions 18 and word lines (not shown) are formed in part of the STI 24 and the substrate 16, and an insulating layer 30 and a semiconductor layer 32 are sequentially formed on the STI 24 and the substrate 16. Next, a photo-etching process is conducted to remove part of the semiconductor layer 32, part of the insulating layer 30, and part of the substrate 16 to form a trench 34 in the substrate 16, in which part of the trench 34 within the substrate 16 is surrounded by the STI 24. In this embodiment, the insulating layer 30 preferably includes a multi-layered structure which could further includes a silicon oxide layer 36, a silicon nitride layer 38, and another silicon oxide layer 40 while the semiconductor layer 32 atop the insulating layer 30 preferably includes amorphous silicon, but not limited thereto.

Figure 3:
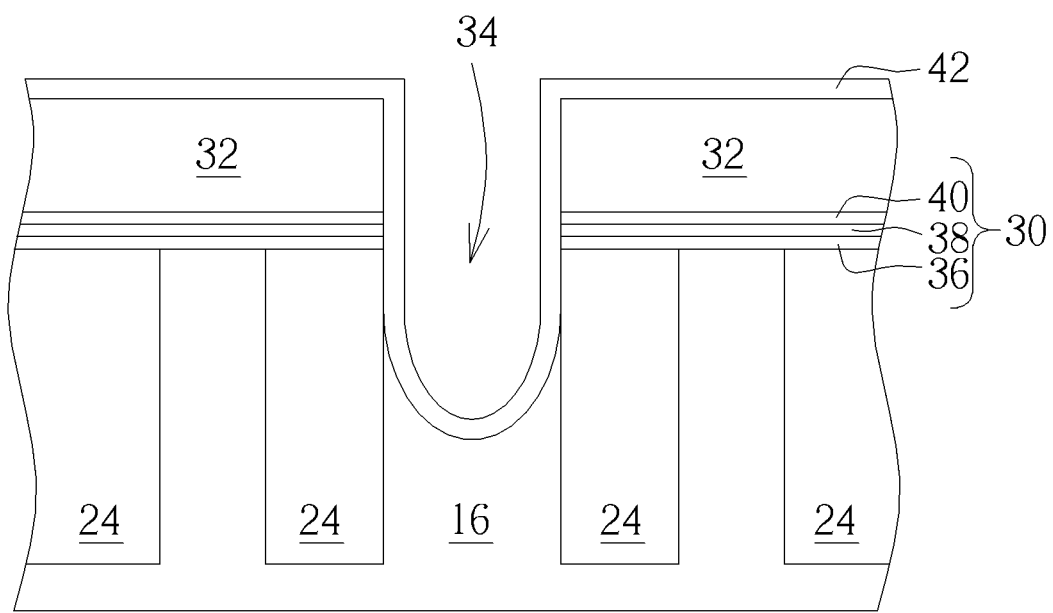

Next, as shown in FIG. 3, a liner 42 is formed in the trench 34 without filling the trench 34 completely, in which the liner 42 preferably covers the top surface of the semiconductor layer 32, sidewalls of the semiconductor layer 32, sidewalls of the insulating layer 30, and the surface of the substrate 16 under the trench 34. In this embodiment, the liner 42 is preferably made of silicon nitride, but according to other embodiments of the present invention, the liner 42 could also be made of dielectric layer such as but not limited to for example $SiO_2$, SiON, SiCN, or combination thereof.

Figure 4:
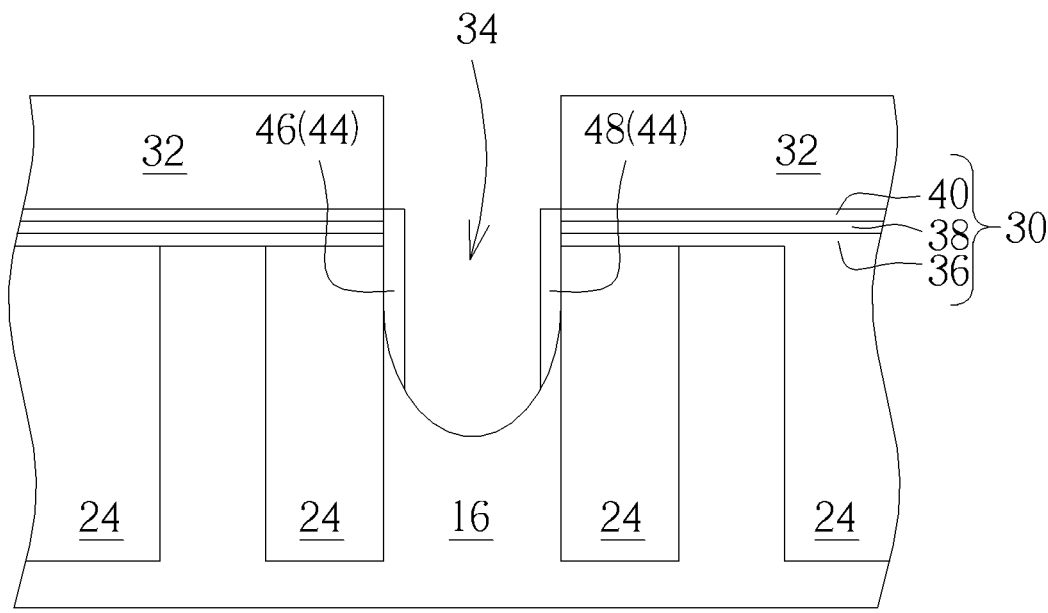

Next, as shown in FIG. 4, an etching process is conducted to remove part of the liner 42 for forming a spacer 44 adjacent to two sides of the trench 34. In this embodiment, the etching process is preferably accomplished by using a gas containing fluorine to remove part of the liner 42 for forming the spacer 44, in which the spacer 44 in real process or if viewed from a top view angle would be formed on sidewalls of the trench 34 to surround the entire trench 34. Nevertheless as disclosed in the cross-sectional view shown in FIG. 4, the spacer 44 is disposed on sidewalls of the STI 24 and/or substrate 16 adjacent to two sides of the trench 34, in which the spacer 44 further includes a spacer 46 disposed on sidewalls of the STI 24 and insulating layer 30 on left side of the trench 34 and another spacer 48 disposed on sidewalls of the STI 24 and insulating layer 30 on right side of the trench 34. The top surface of the spacer 44 formed at this stage is preferably even with or slightly lower than the bottom surface of the semiconductor layer 32, in which the height of each of the spacers 46, 48 at this stage is preferably between 45 nm to 55 nm or most preferably about 50 nm while the widths of each of the spacers 46, 48 is preferably between 25 nm to 35 nm or most preferably around 30 nm.

Figure 5:
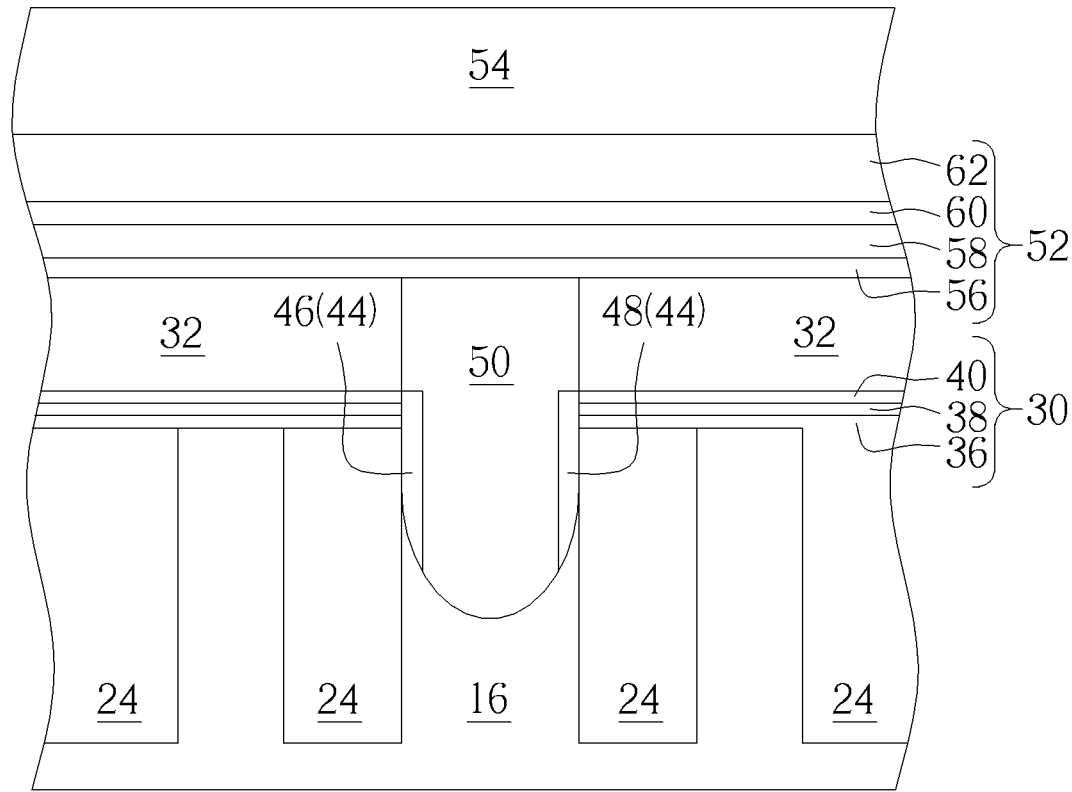

Next, as shown in FIG. 5, a non-metal conductive layer 50 is formed in the trench 34 to fill the trench 34 completely and covering the surface of the semiconductor layer 32, and a planarizing process such as chemical mechanical polishing (CMP) process is conducted to remove part of the conductive layer 50 so that the top surfaces of the remaining conductive layer 50 and the semiconductor layer 32 are coplanar. Next, at least a metal layer 52 is formed on the conductive layer 50 and a mask layer is formed on the metal layer 52. In this embodiment, the non-metal conductive layer 50 could include polysilicon, amorphous silicon, other silicon-containing or non-silicon containing non-metal conductive material. The metal layer 52 is preferably a metal stack structure which could include a titanium (Ti) layer 56, a titanium nitride (TiN) layer 58, a tungsten silicide (WSi) layer 60, and a tungsten (W) layer 62. The mask layer 54 is preferably a SiN layer, but could also include other insulating material including but not limited to for example $SiO_2$, SiON, SiCN, or combination thereof.

Figure 6:
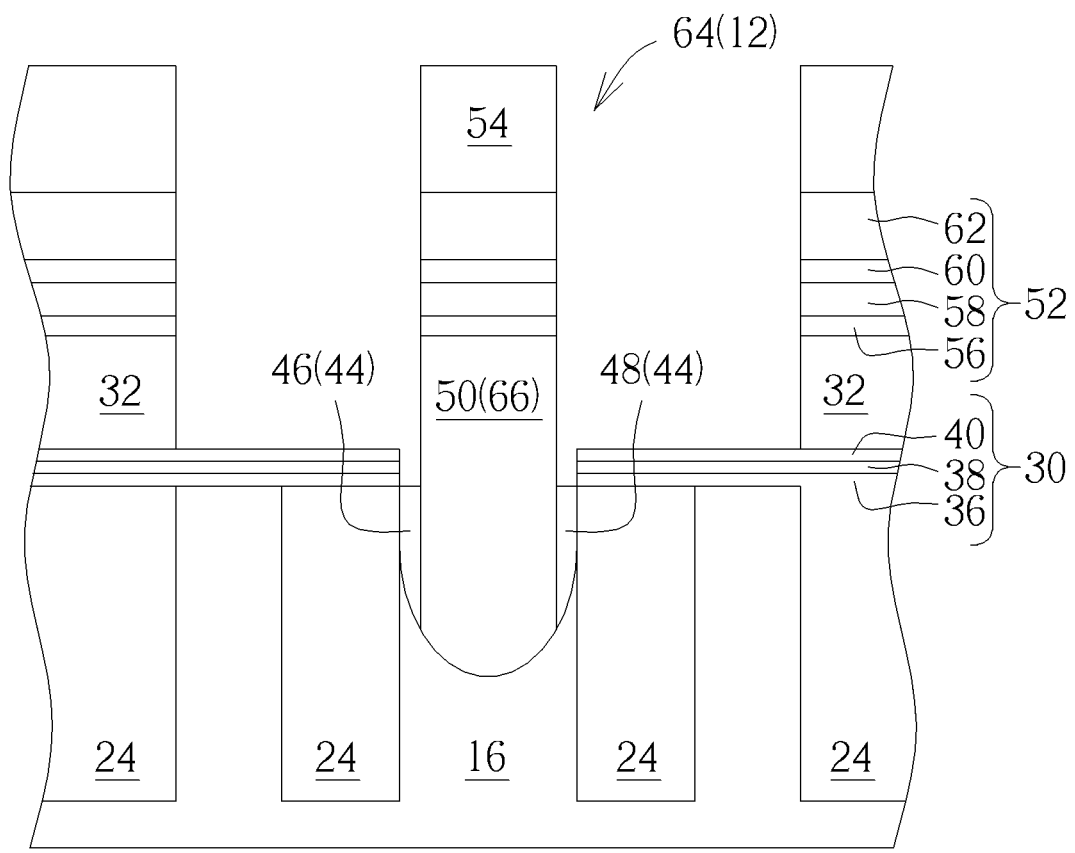

Next, as shown in FIG. 6, a photo-etching process is conducted to pattern the mask layer 54, the metal layer 52, and the conductive layer 50 to form a bit line structure 64 on the substrate 16. Preferably, the spacer 44 formed between the bit line structure 64 and the STI 24 through the aforementioned process could be used to prevent issue such as leakage. In this embodiment, the formation of the bit line structure 64 could be accomplished by first forming a patterned resist (not shown) on the mask layer 54, and then conducting one or more etching processes by using gas such as HBr to remove part of the mask layer 54, part of the metal layer 52, and part of the conductive layer 50, in which the patterned mask layer 54, metal layer 52, and conductive layer 50 together constitute a bit line structure 64 while the lower portion of the conductive layer 50 contacting the substrate 16 also serving as a bit line contact 66.

It should be noted that the spacer 44 disposed between the conductive layer 50 and the STI 24 could be partially removed during the aforementioned patterned process so that the height of the remaining spacer 44 could be slightly lower than the height of the spacer 44 shown in FIG. 4 after the bit line structure 64 is formed. In this embodiment, the top surface of the remaining spacer 44 at this stage is preferably even with the top surface of the substrate 16. Nevertheless, according to other embodiments of the present invention, the top surface of the remaining spacer 44 could also be between the top surface and bottom surface of the insulating layer 30 or even below the top surface of the substrate 16, which are all within the scope of the present invention. Next, storage node contacts could be formed adjacent to two sides of the bit line structure 64 to electrically connect source/drain region and capacitors formed in the later process depending on the demand of the process. Since the fabrication of storage node contacts and capacitors are well known to those skilled in the art, the details of which are not explained herein for the sake of brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
   a bit line structure on a substrate, wherein the bit liner structure comprises:
      a bit line contact; and
      a metal stack on the bit line contact; and
   a spacer around and directly contacting the bit line contact, wherein a top surface of the spacer is even with or lower than a top surface of the substrate, a bottommost surface of the bit line structure contacts the substrate directly, and a height of the bit line contact is greater than twice a height of the spacer.

2. The semiconductor device of claim 1, further comprising a shallow trench isolation (STI) in the substrate.

3. The semiconductor device of claim 2, wherein the spacer is surrounded by the STI.

4. The semiconductor device of claim 2, wherein a top surface of the spacer is even with or lower than a top surface of the STI.

5. The semiconductor device of claim 2, wherein the bit line structure comprises:
   a conductive layer in the substrate;
   a metal layer on the conductive layer; and
   a mask layer on the metal layer.

6. The semiconductor device of claim 5, wherein a bottom surface of the conductive layer is lower than a top surface of the substrate.

7. The semiconductor device of claim 5, wherein the spacer is between the conductive layer and the STI.

8. The semiconductor device of claim 1, wherein the spacer comprises silicon nitride.

9. The semiconductor device of claim 1, wherein the spacer comprises silicon oxide.

10. The semiconductor device of claim 1, wherein a bottom surface of the spacer directly contacting the substrate comprises a curve.

11. The semiconductor device of claim 1, wherein the spacer comprises an I-shape.

\* \* \* \* \*